United States Patent [19]

Miyazu et al.

[11] Patent Number: 5,227,275
[45] Date of Patent: Jul. 13, 1993

[54] LIGHT SENSITIVE ELEMENT FOR MAKING LITHOGRAPHIC PRINTING PLATE MATERIAL

[75] Inventors: Hiroshi Miyazu; Yoshikazu Takaya, both of Nagaokakyo, Japan

[73] Assignee: Mitsubishi Paper Mills Limited, Tokyo, Japan

[21] Appl. No.: 952,142

[22] Filed: Sep. 28, 1992

Related U.S. Application Data

[63] Continuation of Ser. No. 637,444, Jan. 4, 1991, abandoned.

[30] Foreign Application Priority Data

Jan. 8, 1990 [JP] Japan .................. 2-001776

[51] Int. Cl.$^5$ .............................................. G03C 8/00
[52] U.S. Cl. .................... 430/204; 430/227; 430/531; 430/533; 430/534
[58] Field of Search ............... 430/204, 533, 227, 534, 430/531

[56] References Cited

U.S. PATENT DOCUMENTS 4,093,458  6/1978  McGrail et al. .................... 430/555
4,879,193  11/1989  Takaya et al. ...................... 430/555
4,933,267  6/1990  Ishigaki et al. ..................... 430/555

FOREIGN PATENT DOCUMENTS 244,078  11/1987  Europen Pat. Off.

OTHER PUBLICATIONS

French Search Report, Application No. BE 9100009.

*Primary Examiner*—Jack P. Brammer
*Attorney, Agent, or Firm*—Cushman, Darby & Cushman

[57] ABSTRACT

Disclosed is a lithographic printing plate material which provides a printing plate which causes no peeling of film even after printing of a large number of prints and even with use of special printing ink such as ultraviolet-curing ink. This printing plate material comprises a polyester film subjected to hydrophilization treatment by coating with an organic copolymer as a support and at least one undercoat layer, at least one emulsion layer containing a silver halide, and an image receiving layer containing physical development nuclei provided on the support in this order, characterized in that the lowermost undercoat layer contiguous to the support contains a bisphenol type epoxy resin latex.

2 Claims, No Drawings

LIGHT SENSITIVE ELEMENT FOR MAKING LITHOGRAPHIC PRINTING PLATE MATERIAL

This is a continuation of application Ser. No. 07/637,444, filed on Jan. 4, 1991, which was abandoned upon the filing hereof.

BACKGROUND OF THE INVENTION

The present invention relates to a lithographic printing plate material which utilizes silver complex diffusion transfer process (DTR process) and in particular, to a lithographic printing plate material in which a polyester film coated with an organic copolymer composition for imparting hydrophilicity and for adhesion is used as a support.

A method of making lithographic printing plate which comprises imagewise exposing a lithographic printing plate material for DTR process, more particularly, a material comprising a support and, provided thereon, at least one silver halide emulsion layer and a nuclei layer containing physical development nuclei particles and then subjecting the exposed material to silver complex diffusion transfer development, thereby to form metallic silver image on the surface of the material is called "direct plate making method" and this method has the advantages in its simplicity and rapidness as compared with conventional plate making method which uses a lith film as an intermediate process, but has the defect in printability that only a small number of prints can be obtained. Under the circumstances, various improvements have been proposed.

The lithographic printing plate materials which are disclosed in Japanese Patent Kokoku No. 48-30562 and which have the above-mentioned defect have been considerably improved in printability as proposed in Japanese Patent Kokoku Nos. 51-15765 and 51-16803 and Japanese Patent Kokai Nos. 51-111103, 52-150105, 53-9603, 54-135002, 55-7704, 56-27151, and 57-86835.

On the other hand, as support, various supports are used as also mentioned in the above patent publications and plastics are mainly used for improving printability and inhibiting extension of plate or penetration of water thereinto during printing. Of the plastics, polyester films are mainly used which are superior in mechanical properties, dimensional stability, heat resistance, chemical resistance and transparency.

As well known, however, polyester films are generally high in crystallinity, chemically inert, excellent in chemical resistance and besides, highly hydrophobic because of having no hydrophilic group and so it has been difficult to attain satisfactory adhesion to hydrophilic photographic emulsion layer.

Hitherto, various attempts have been made in order to solve the above problem. One of them is to subject a polyester film to surface activation treatment such as chemical treatment, mechanical treatment, discharging treatment, flame treatment, ultraviolet ray treatment, high frequency treatment, plasma treatment, laser treatment, mixed acid treatment or ozone oxidation treatment and then directly coat a photographic emulsion layer thereon. These methods are proposed in U.S. Pat. No. 2,934,937 and 3,475,193, British Patent No. 1,215,234, and Japanese Patent Kokai Nos. 53-13672 and 55-18469. However, the thus surface treated polyester films are improved in adhesion to hydrophilic photographic emulsion layer, but are inferior in adhesion strength.

Another method comprises subjecting a polyester film to surface treatment to increase adhesion to hydrophilic photographic layer, thereafter providing a subbing layer of an organic copolymer composition and then coating a photographic emulsion thereon. This method can be roughly classified into the following two.

(1) A method of coating a composition comprising an organic solvent which is swelling agent or dissolving agent and an organic copolymer (hereinafter referred to as "solvent subbing method"). This method is disclosed, for example, in U.S. Pat. No. 2, 830,030, British Patent Nos. 772,600, 776,157, and 785,789, and Japanese Patent Kokai Nos. 50-1718 and 50-825.

(2) A method of coating an aqueous composition of organic copolymer substantially free from organic solvent (so-called latex) (hereinafter referred to as "aqueous subbing method"). This method is disclosed, for example, in Japanese Patent Kokoku Nos. 44-13278 and 45-10988, Japanese Patent Kokai Nos. 49-11118, 51-27918, 52-114670, 54-11177, 55-67745, 58-169145, and 59-77439.

The solvent subbing method of (1) has the problem of deterioration in properties of polyester film in subbing step and the problem in hygienic safety caused by the organic solvents and the problem of environmental pollution and now the aqueous undercoating method of (2) is increasingly employed.

However, when the method of (2) is applied to the lithographic printing material of Japanese Patent Kokoku No. 48-30562 referred to hereabove, no problem has occurred for printing of a small number of prints in initial time, but when printability has been improved and a large number of prints are to be made or when a special ink such as ultraviolet-curing ink is used for printing, peeling of photographic layer from support, so-called "peeling of film" occurs during printing and eventually printing becomes impossible. This is a serious defect. It is considered that this phenomenon of film peeling is caused by organic solvent in printing ink. There has not yet been found a subbing method which causes no peeling of film, though degree of peeling depends on kind of organic copolymer used in subbing layer or kind of subbing method. To find such subbing method is very important for lithographic printing plate which has polyester film as a support and which utilizes DTR process (especially for printing of a large number of prints).

SUMMARY OF THE INVENTION

The object of the present invention is to provide an improved lithographic printing plate material utilizing DTR process which has a subbed polyester film coated with an organic copolymer composition as a support, but which undergoes no film peeling during printing of a large number of prints or printing with special ink.

The above object of the present invention has been attained by a lithographic printing plate material which comprises a polyester film coated with a subbing layer of an organic copolymer as a support and at least one undercoat layer, at least one emulsion layer containing light-sensitive silver halide and an image receiving layer containing physical development nuclei which are coated on the support in this order, wherein the undermost layer contiguous to the support (undercoat layer) contains a bisphenol type epoxy resin latex.

DESCRIPTION OF THE INVENTION

It has been well known to add an epoxy compound in photographic layer of usual light-sensitive materials, but generally this is used as a hardener and the object can be attained by using an epoxy compound having at least two epoxy groups. On the other hand, the bisphenol type epoxy resin latex used in the present invention has the effect to inhibit film peeling during printing which is caused by organic solvent contained in printing ink and thus is utterly different from normal hardeners in its action.

Furthermore, it is also known to contain a compound containing epoxy group in its molecule as one of organic copolymer or together with organic copolymer in subbing layer for hydrophilization and improving adhesion of polyester film as disclosed, for example, in Japanese Patent Kokai Nos. 51-103422, 59-94756, 60-191249, and 60-213941. When a subbing layer containing epoxy group in its molecule and a hydrophilic photographic layer containing no bisphenol type epoxy resin latex mentioned above are coated on the polyester film, adhesion can be somewhat improved as compared with when the subbing layer does not contain the compound having epoxy group in its molecule, but the adhesion is not enough as compared with adhesion obtained by the present invention and besides in this case film peeling occurs during printing of a large number of printings. On the other hand, when a hydrophilic photographic layer containing the above-mentioned bisphenol type epoxy resin latex is coated on the subbed polyester film, sufficient adhesion can be obtained and film peeling does not occur.

When a hydrophilic photographic layer containing polyfunctional epoxy compound mentioned in Japanese Patent Kokai No. 63-228167 is coated on the subbed polyester film, a sufficient adhesion is obtained, but the adhesion obtained by the present invention is much higher than that.

Mechanism for such effect being exhibited by the bisphenol type epoxy resin latex contained in hydrophilic photographic layer is not clear, but such effect is unexpectable from known information.

Accordingly, the object of the present invention is to provide a lithographic printing plate material which comprises a polyester film hydrophilized by coating thereon an organic copolymer composition as a support and an undercoat layer, an emulsion layer containing light-sensitive silver halide and an image receiving layer containing physical development nuclei provided on the support in this order and which has sufficient adhesion and shows no film peeling even when a large number of copies are printed or printing is carried out with a special ink.

The support having a hydrophilic subbing layer comprising an organic copolymer composition used in the present invention is a polyester film support which comprises a polyester film subjected to a hydrophilization treatment with, for example, an organic copolymer composition as disclosed, for example, in the above-mentioned patent publications.

The bisphenol type epoxy resin latexes are emulsions of epoxy resins represented by the following formula (I) and synthesized by known processes.

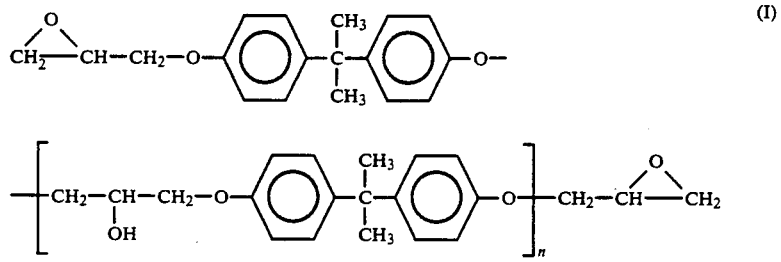

Epoxy equivalent of the above latexes is not critical, but is preferably 500 or more.

The undercoat layer contiguous to the support in the present invention is an undercoat layer comprising gelatin as a hydrophilic polymer as disclosed in Japanese Patent Kokai Nos.48-5503, 48-100203, 49-55402, 53-21602 and 53-9603. Amount of the bisphenol type epoxy resin latex contained in this undercoat layer is preferably 50 mg–3000 mg, more preferably 150 mg–1000 mg per 1 g of gelatin contained in the undercoat layer.

If amount of the bisphenol type epoxy resin latex is less than 50 mg, it is difficult to obtain sufficient adhesion and an amount of more than 3000 mg is not preferred in view of influence on photographic characteristics and printability. As hydrophilic polymer used in undercoat layer, various gelatins may be used and besides, a part of gelatin may be replaced with hydrophilic colloid as mentioned in Japanese Patent Kokoku No. 55-100554, sodium alginate, PVA, PVP, or the like. Further, the undercoat layer may serve as anti-halation layer, too and besides, if necessary, various activators, hardeners, matting agents, and additives customarily used in this field may also be used.

As light-sensitive silver halide emulsion layers, there may be used any of those which are known in this field, but preferred are those which are mentioned in Japanese Patent Kokai No. 49-55402.

As physical development nuclei layer, there may be used any of those which are mentioned, for example, in Japanese Patent Kokoku No. 48-30562 and Japanese Patent Kokai Nos. 49-55402 and 53-21602.

Generally, the lithographic printing plate material of the present invention is imagewise exposed and then processed with an alkaline developer and, if necessary, is subjected to treatments for plate making and printing with neutralizing solution, fixing solution, etch solution, dampening solution or the like. The developing solution may be any developing solutions such as usual alkaline developing solutions for photography containing developing agent such as hydroquinone and so-called alkaline activation developing solutions containing substantially no developing agent with the developing agent being contained in the light-sensitive material. These developing solutions may contain compounds as mentioned in Japanese Patent Kokoku No. 51-486 and Japanese Patent Kokai No. 52-150105 depending on objects.

Neutralizing solution, fixing solution, etch solution and dampening solution used in the present invention may have any compositions known for one skilled in the art depending on the objects and kinds of plate materials.

The present invention will be explained by the following nonlimiting examples.

EXAMPLE

The following undercoat layer which also served as antihalation layer was coated on a support which was a polyester film subjected to aqueous subbing treatment with subbing composition containing epoxy compound mentioned in Japanese Patent Kokai No. 60-213942 for the purpose of hydrophilization.

| Undercoat layer | |
|---|---|
| Gelatin | 25 g |
| Matting agent (silica powder) | 6 g |
| 2,4-Dichloro-6-hydroxy-S-triazine salt (10% aqueous solution) | 6 cc |
| Carbon black dispersion (solid content 32%) | 1.5 g |
| Surface active agent | 3 cc |
| Water to make up 450 g. | |

Coating amount was 45 cc/m² in moisture content.

To the above undercoat layer was added sorbitol polyglycidyl ether or bisphenol type epoxy resin latex of the formula (I) (epoxy equivalent 900) in the following manner to make samples.

| | |
|---|---|
| No epoxy resin latex was added. | Comparative Example 1 |
| Sorbitol polyglycidyl ether (10% methanolic solution) 9 cc | Comparative Example 2 |
| Bisphenol type epoxy resin latex 18 g | The present invention |

On the undercoat layer was coated an orthochromatically sensitized high-contrast silver chloride emulsion at a coating amount of 1.5 g/m² in terms of silver nitrate. After drying, the emulsion layer was heated to 50° C. for 2 hours and a physical development nuclei layor was coated thereon as mentioned in Japanese Patent Kokai No. 55-14645 and was dried.

The sample was imagewise exposed and was subjected to development and neutralization treatments as mentioned in the above Japanese Patent Kokai No. 55-14645 and then dried to obtain a printing plate.

Printing was carried out using the resulting printing plate by an offset printing machine "1250" manufactured by Azolesso Multigraph Co. using etch solution and dampening solution mentioned in Japanese Patent Kokai No. 56-6237 and usual sumi ink (black ink) and an ultraviolet-curing ink as a special ink. Degree of film peeling after printing of given number of prints was evaluated. ◯: No film peeling occurred. Δ: Film peeling partly occurred. ✕: Film peeling occurred over the whole surface.

| Result 1 Usual sumi ink was used. | | | |
|---|---|---|---|
| | 10000 prints | 20000 prints | 30000 prints |
| Comparative Example 1 | ◯-Δ | Δ | Δ |
| Comparative Example 2 | ◯ | ◯-Δ | Δ |
| The present invention | ◯ | ◯ | ◯ |

| Result 2 Ultraviolet-curing ink was used. | | | | |
|---|---|---|---|---|
| | 5000 prints | 10000 prints | 15000 prints | 20000 prints |
| Comparative Example 1 | ◯ | Δ | Δ-✕ | ✕ |
| Comparative Example 2 | ◯ | ◯ | ◯-Δ | Δ |
| The present invention | ◯ | ◯ | ◯ | ◯ |

As shown above, in the case of printing plate which contains epoxy compound in only the subbing layer (Comparative Example 1) and printing plate containing polyfunctional epoxy compound having at least three epoxy groups in molecule (Comparative Example 2), peeling of film occurred both in printing with the usual sumi ink and in printing with the ultraviolet-curing ink which is a special ink while no peeling of film occurred in case of the printing plate of the present invention which contained bisphenol type epoxy resin latex. Thus, the present invention has advantageous effects.

As explained above, when a polyester film subjected to hydrophilization subbing treatment by coating with an organic copolymer is used as a support, as is clear from the results of the example, peeling of film occurs after printing of a large number of prints and by printing with special ink according to the conventional technique while no peeling of film occurs when a bisphenol type epoxy resin latex is contained in an undercoat layer contiguous to the support according to the present invention.

What is claimed is:

1. A light sensitive element for making a lithographic printing plate therefrom by utilizing a silver complex diffusion process which comprises:
   a polyester film;
   a hydrophilic support layer comprising an organic copolymer provided on the polyester film;
   at least one undercoat layer provided on the support layer containing a bisphenol type epoxy resin latex having an epoxy equivalent weight of at least 500, the amount of the bisphenol type epoxy resin latex being within the range of 50 to 3000 mg per 1 g of a gelatin contained in the undercoat layer;
   at least one emulsion layer containing a silver halide provided on the at least one undercoat layer; and
   an image receiving layer containing physical development nuclei provided on the at least one emulsion layer.

2. A lithographic printing plate material according to claim 1, wherein the bisphenol type epoxy resin latex is an emulsion of an epoxy resin represented by the following formula (I):

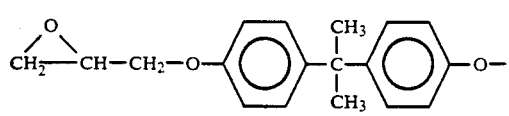
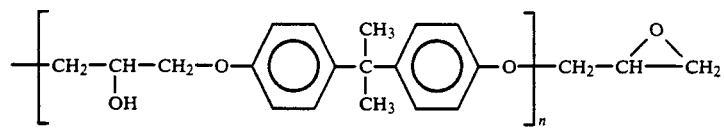
wherein n is positive integer greater than 0.
* * * * *